US012032042B2

(12) United States Patent
Belin

(10) Patent No.: US 12,032,042 B2
(45) Date of Patent: Jul. 9, 2024

(54) CURRENT SENSOR FOR COMPENSATION OF ON-DIE TEMPERATURE GRADIENT

(71) Applicant: Allegro MicroSystems, LLC, Manchester, NH (US)

(72) Inventor: Noémie Belin, Villejuif (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/660,254

(22) Filed: Apr. 22, 2022

(65) Prior Publication Data

US 2022/0244324 A1 Aug. 4, 2022

Related U.S. Application Data

(63) Continuation of application No. 16/364,951, filed on Mar. 26, 2019, now Pat. No. 11,346,894.

(51) Int. Cl.
  *G01R 33/00* (2006.01)
  *G01R 15/20* (2006.01)
  *G01R 19/32* (2006.01)
  *G01R 33/09* (2006.01)
(52) U.S. Cl.
  CPC ....... *G01R 33/0082* (2013.01); *G01R 15/205* (2013.01); *G01R 19/32* (2013.01); *G01R 33/093* (2013.01); *G01R 33/098* (2013.01)
(58) Field of Classification Search
  CPC .. G01R 33/0082; G01R 15/205; G01R 19/32; G01R 33/093; G01R 33/098
  See application file for complete search history.

(56) References Cited

U.S. PATENT DOCUMENTS

| 7,259,545 | B2 | 8/2007 | Stauth et al. |
| 10,509,058 | B2 | 12/2019 | Cadugan et al. |
| 10,578,684 | B2 | 3/2020 | Cadugan et al. |
| 11,346,894 | B2 | 5/2022 | Belin |
| 2007/0096716 | A1* | 5/2007 | Shoji .................... G01R 15/205 338/32 R |

(Continued)

OTHER PUBLICATIONS

Office Action dated Aug. 19, 2020 for U.S. Appl. No. 16/364,951; 21 pages.

(Continued)

*Primary Examiner* — Farhana A Hoque
*Assistant Examiner* — Joseph O Nyamogo
(74) *Attorney, Agent, or Firm* — Daly, Crowley, Mofford & Durkee, LLP

(57) ABSTRACT

A sensor including: a substrate having a first region and a second region; a first series of first magnetoresistive (MR) elements formed on the substrate, the first series of first MR elements including at least two first MR elements; and a second series of second MR elements that is coupled in parallel with the first series of first MR elements to form a bridge circuit, the second series of second MR elements being formed on the substrate, the second series of second MR elements including at least two second MR elements, each of the at least two second MR elements having a different pinning direction than each of the at least two first MR elements, wherein one of the at least two first MR elements and one of the at least two second MR elements are formed in the first region of the substrate and have different pinning directions.

23 Claims, 10 Drawing Sheets

(56) References Cited

U.S. PATENT DOCUMENTS

| | | | |
|---|---|---|---|
| 2007/0132464 A1* | 6/2007 | Desplats | G01R 33/02 324/252 |
| 2008/0012558 A1 | 1/2008 | Rossler et al. | |
| 2008/0272771 A1* | 11/2008 | Guo | G01R 33/093 324/260 |
| 2012/0119729 A1 | 5/2012 | Komasaki et al. | |
| 2012/0161756 A1* | 6/2012 | Paci | B82Y 25/00 324/228 |
| 2013/0008022 A1* | 1/2013 | Yao | G01R 15/205 29/830 |
| 2013/0265040 A1 | 10/2013 | Ide et al. | |
| 2014/0009145 A1 | 1/2014 | Suto | |
| 2014/0021943 A1 | 1/2014 | Watanabe et al. | |
| 2015/0054498 A1 | 2/2015 | Wada et al. | |
| 2017/0045380 A1 | 2/2017 | Ueda et al. | |
| 2017/0322052 A1* | 11/2017 | Paul | G01R 33/04 |
| 2019/0235032 A1 | 8/2019 | Lassalle-Balier | |
| 2021/0011096 A1 | 1/2021 | Lassalle-Balier et al. | |
| 2021/0325486 A1 | 10/2021 | Cai | |

OTHER PUBLICATIONS

Response to Office Action dated Aug. 19, 2020 filed on Nov. 13, 2020 for U.S. Appl. No. 16/364,951; 16 pages.
Final Office Action dated Jan. 6, 2021 for U.S. Appl. No. 16/364,951; 32 pages.
Response to Final Office Action dated Jan. 6, 2021 filed on Apr. 5, 2021 for U.S. Appl. No. 16/364,951; 19 pages.
Office Action dated May 11, 2021 for U.S. Appl. No. 16/364,951; 22 pages.
Response to Office Action dated May 11, 2021 filed on Aug. 11, 2021 for U.S. Appl. No. 16/364,951; 12 pages.
Final Office Action dated Sep. 29, 2021 for U.S. Appl. No. 16/364,951; 19 pages.
Response to Final Office Action dated Sep. 29, 2021 filed on Dec. 21, 2021 for U.S. Appl. No. 16/364,951; 10 pages.
Notice of Allowance Dated Feb. 7, 2022 for U.S. Appl. No. 16/364,951; 9 pages.
Search Report and Written Opinion of the ISA dated Nov. 23, 2023 for International Application No. PCT/US2023/071167; 14 Pages.
U.S. Appl. No. 18/070,918, filed Nov. 29, 2022, Romero.

* cited by examiner

CURRENT SENSOR FOR COMPENSATION OF ON-DIE TEMPERATURE GRADIENT

CROSS-REFERENCE TO RELATED APPLICATIONS

This application is a Continuation of U.S. patent application Ser. No. 16/364,951, entitled "Current Sensor for Compensation of On-Die Temperature Gradient," filed on Mar. 26, 2019, which application is hereby incorporated herein by reference in its entirety.

BACKGROUND

As is known in the art, one type of current sensor uses magnetoresistance (MR) elements, which change resistance in response to a magnetic field associated with a current passing through a conductor. A resultant voltage output signal is proportional to the magnetic field. Some conventional current sensors of this type use an anisotropic magnetoresistance (AMR) element.

During the operation of current sensors that use MR elements, large on-die temperature gradients can be created due to a current flowing in metal layers that are situated on the same die or nearby die. Such temperature gradients can diminish the accuracy of the current sensors, as the operation of MR elements is normally affected by temperature.

SUMMARY

According to aspects of the disclosure, a sensor is provided comprising: a substrate having a first region and a second region; a first series of first magnetoresistive (MR) elements formed on the substrate, the first series of first MR elements including at least two first MR elements; and a second series of second MR elements that is coupled in parallel with the first series of first MR elements to form a bridge circuit, the second series of second MR elements being formed on the substrate, the second series of second MR elements including at least two second MR elements, each of the at least two second MR elements having a different pinning direction than each of the at least two first MR elements, wherein one of the at least two first MR elements and one of the at least two second MR elements are formed in the first region of the substrate and have different pinning directions, and wherein another one of the at least two first MR elements and another one of the at least two second MR elements are formed in the second region of the substrate and have different pinning directions.

According to aspects of the disclosure, a sensor is provided comprising: a substrate having a first region and a second region; a first series of first magnetoresistive (MR) elements formed on the substrate; a second series of second MR elements formed on the substrate, the second series of second MR elements being coupled in parallel to the first series of MR elements to form a bridge circuit, at least two of the first MR elements having a first pinning direction and at least two of second MR elements having a second pinning direction that is different from the first pinning direction; and a body arranged to encapsulate the substrate, the first series of first MR elements, and the second series of second MR elements, wherein one of the first MR elements and one of the second MR elements are formed in the first region of the substrate and have different pinning directions, wherein another one of the first MR elements and another one of the second MR elements are formed in the second region of the substrate and have different pinning directions.

According to aspects of the disclosure, a sensor is provided comprising: a substrate having a first region and a second region; a first series of first magnetoresistive (MR) elements formed on the substrate, the first series of first MR elements including two first pairs of first MR elements, each first pair of first MR elements including first MR elements that have opposite pinning directions, such that the first MR elements in each of the first pairs are formed in different ones of the first region and the second region of the substrate; and a second series of second MR elements formed on the substrate, the second series of second MR elements including two second pairs of second MR elements, each second pair of second MR elements including second MR elements that have opposite pinning directions, such that the second MR elements in each of the second pairs are formed in different ones of the first region and the second region of the substrate, wherein a first output node of the bridge circuit is coupled between the two first pairs of first MR elements and a second output node of the bridge circuit is coupled between the two second pairs of second MR elements.

BRIEF DESCRIPTION OF THE DRAWINGS

The foregoing features of the invention, as well as the invention itself may be more fully understood from the following detailed description of the drawings, in which.

DETAILED DESCRIPTION

Figure 1A:
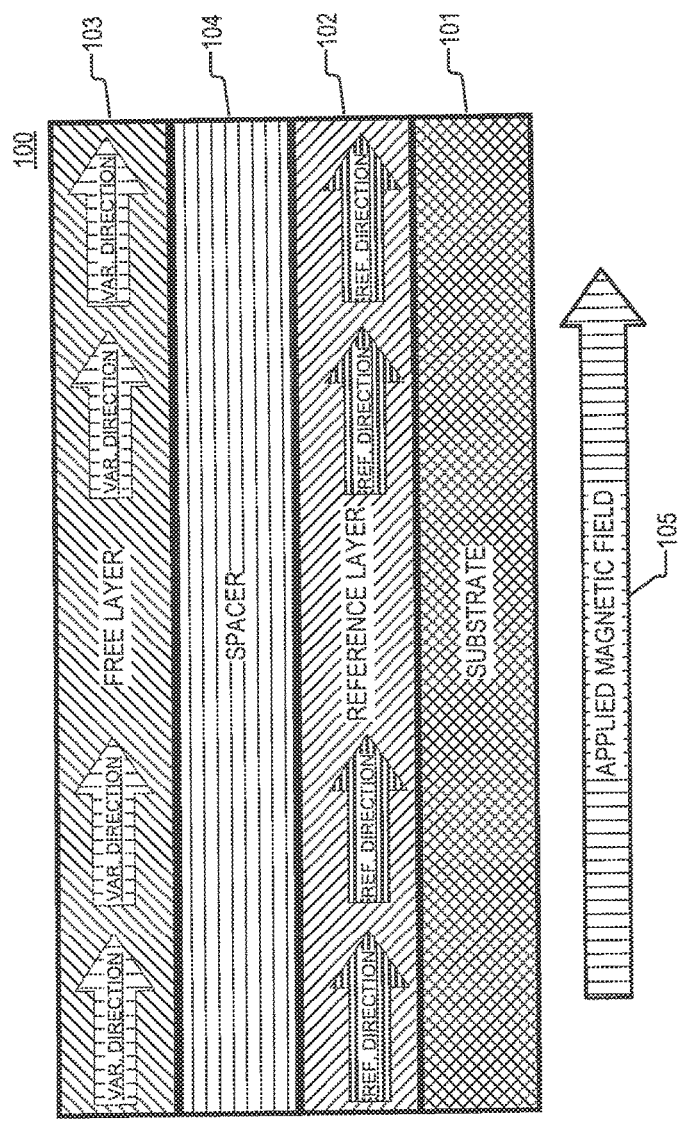
FIG. 1A is a diagram of an example of a magnetoresistive (MR) element, according to aspects of the disclosure.
Figure 1B:
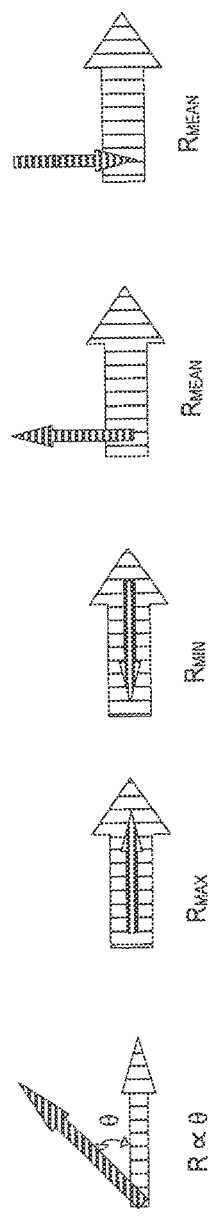
FIG. 1B is a diagram illustrating the operation of the MR element of FIG. 1 when the MR element is exposed to an applied magnetic field, according to aspects of the disclosure.

Before describing example embodiments of the invention, some information is provided. FIG. 1A is a cross-sectional side view of an example of a magnetoresistive (MR) element 100. As illustrated, the MR element 100 may include a substrate 101 having a reference layer 102 formed thereon. Over the reference layer 102, a free layer 103 may be formed that is separated from the reference layer 102 by a spacer 104. Both the reference layer 102 and the free layer 103 are magnetic layers. The orientation of magnetization of the reference layer 102 is fixed, whereas the orientation of magnetization of the free layer 103 is arranged to align with the magnetic field 105 of the surrounding environment. The resistance of the MR element 100 is proportional to the orientation of magnetization of the free layer 103. As shown in FIG. 1B, when the free layer 103 and the reference layer 102 have the same orientation of magnetization, the resistance of the MR element 100 is at its highest. When the reference layer 102 and the free layer 103 have opposite orientations of magnetization, the resistance of the MR element 100 is at its lowest. And when the reference layer 102 and the free layer 103 have perpendicular orientations of magnetization, the resistance of the MR element 100 is at its mean.

FIGS. 1A-B are provided to illustrate the relationship between the resistance of the MR element 100 and the relative orientations of magnetization of the reference and free layers of an MR element 100. Although in the example of FIGS. 1A-B, the MR element 100 is depicted as including only one reference layer and only one free layer, alternative implementations are possible in which the MR element 100 includes multiple reference layers and/or multiple free layers. Furthermore, it will be understood that the MR element 100 may include other components that are not shown in FIG. 1A. Stated succinctly, the present disclosure is not limited to any specific implementation of the MR elements discussed throughout. As used in the present disclosure, the term "pinning direction of an MR element" and its inflected forms shall refer to the orientation of magnetization of a reference layer (or reference layers) of the MR element. As is discussed further below, the pinning direction of an MR element determines whether the resistance of the MR element would increase or decrease when the MR element is subjected to a magnetic field having a particular orientation.

Figure 1D:
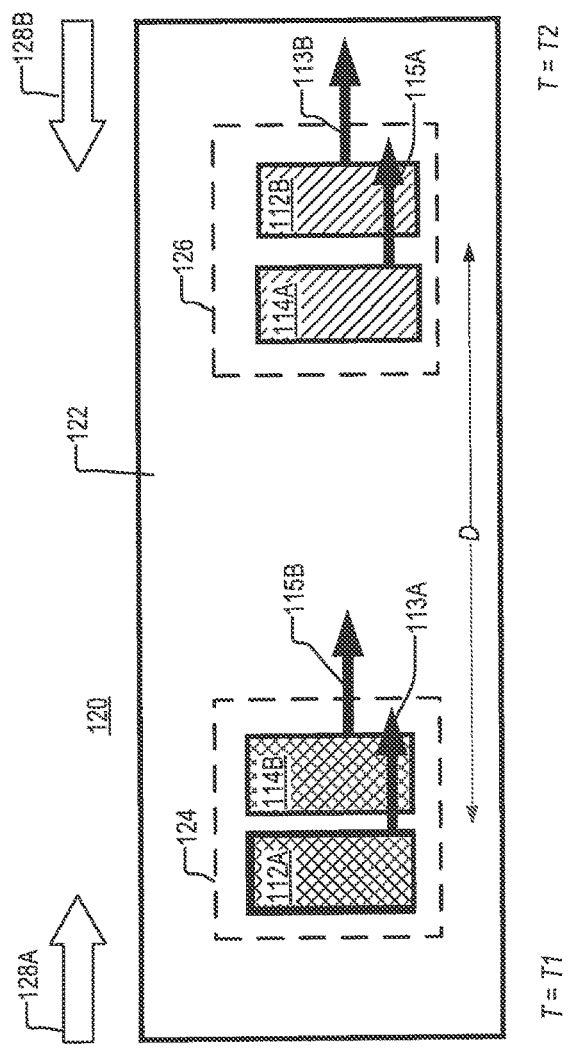
FIG. 1D is a schematic diagram of a sensor die including the bridge circuit of FIG. 1C, according to aspects of the disclosure.
Figure 1C:
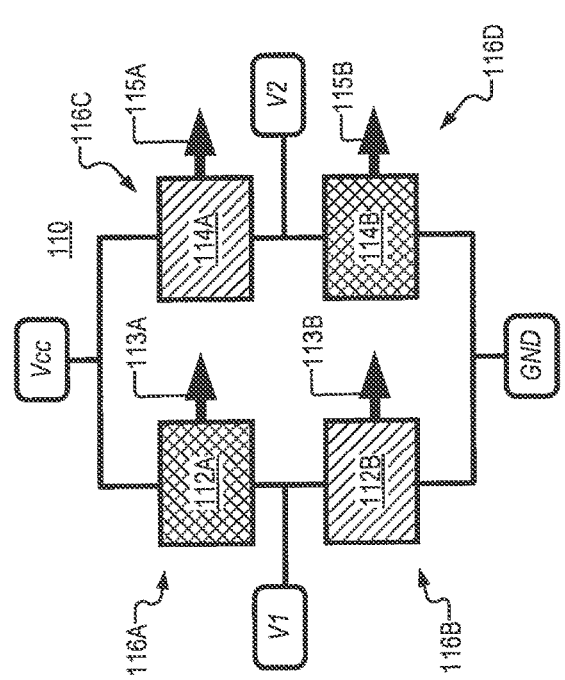
FIG. 1C is a diagram of an example of a bridge circuit, according to aspects of the disclosure.

FIG. 1C shows an example of a bridge circuit 110 including a plurality of MR elements 112 and a plurality of MR elements 114 connected to form a full (or "Wheatstone") bridge. The labels, "VCC" and "GND" indicate voltage and ground supply terminals, respectively. The labels V1 and V2 indicate first and second output voltage terminals of the bridge circuit 110, respectively. On one side of the bridge circuit 110, the MR elements 112A and 112B are connected in series between VCC and GND, such that the MR element 112A forms a first leg 116A of the bridge circuit, and the MR element 112B forms a second leg 116B of the bridge circuit. On the other side of the bridge circuit, the MR elements 114A and 114B are connected in series between VCC and GND, such that the MR element 114A forms a third leg 116C of the bridge circuit 110, and the MR element 114B forms a fourth leg 116D of the bridge circuit 110. A first output voltage terminal "V1" is provided between the first leg 116A and the second leg 116B of the bridge circuit 110. And a second output voltage terminal "V2" is provided between the third leg 116C and the fourth leg 116D of the bridge circuit 110.

FIG. 1D shows a schematic top-down view of a sensor die 120 that includes the bridge circuit 110 of FIG. 1C. The sensor die 120 includes a substrate 122 having the MR elements 112 and 114 formed thereon. The MR elements 112A and 114B are formed in a first region 124 of the substrate 122, while the MR elements 112B and 114A are formed in a second region 126 of the substrate 122. The first region 124 and the second region 126 are separated from each other by a distance D, as shown.

As shown in FIG. 1D, the MR elements 112/114 in the bridge circuit 110 have the same pinning direction, as indicated by arrows 113A-B and 115A-B, and the sensor die 120 is exposed to a differential magnetic field 128A-B, as shown. In region 124 of the substrate 122, the differential magnetic field 128A is positive, and the temperature is T1. In region 126 of the substrate 122, the differential magnetic field 128B is negative, and the temperature is T2. Separating the MR elements 112/114 in different regions 124/126 of the substrate 122 allows the MR elements 112/114 to measure the differential magnetic field 128A-B in two different locations, while the impact of stray fields and average temperature variations is cancelled out as a result of the Wheatstone bridge topology. However, the temperature gradient ΔT=T1−T2 across the sensor die 120 may reduce sensor accuracy. In the example of FIGS. 1C-D, the pinning direction of each one of the MR elements 112/114 is illustrated by the arrows 113A-B and 115A-B attached to the MR element. MR elements 112/114 having the same pinning direction are attached to arrows with the same orientation.

Figure 1E:
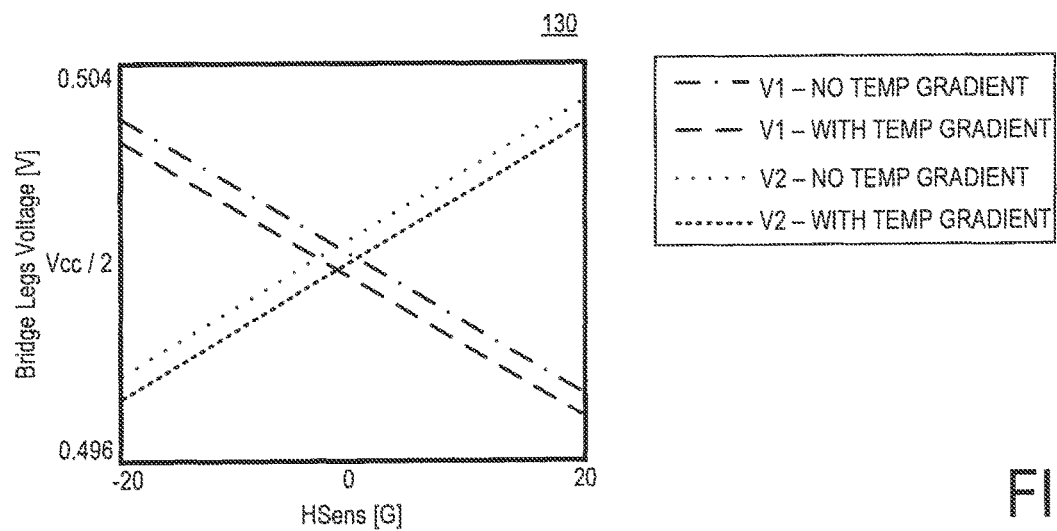
FIG. 1E is a plot illustrating the respective voltages output from the output terminals of the bridge circuit of FIG. 1C as a function of a magnetic field that is applied to the bridge circuit, according to aspects of the disclosure.
Figure 1F:
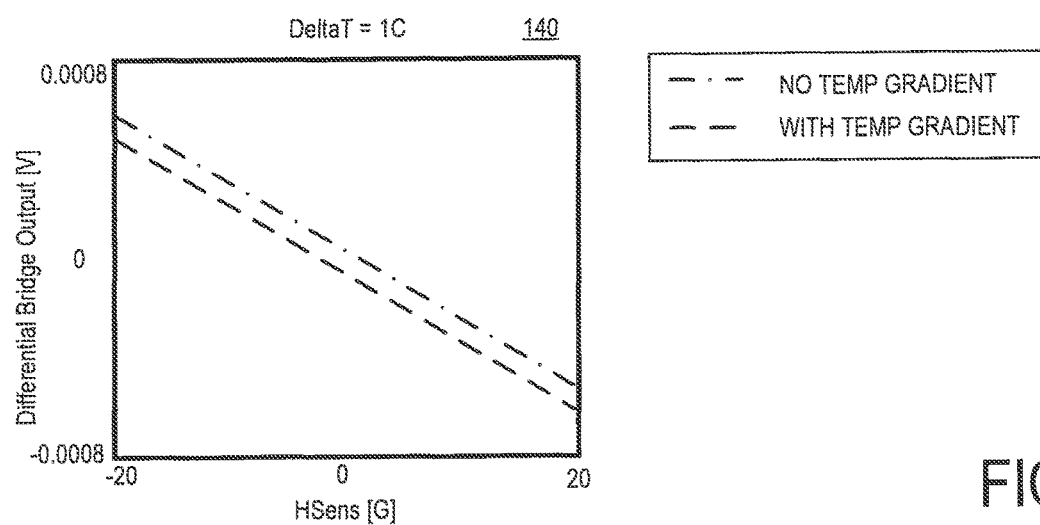
FIG. 1F is a plot of a differential voltage output from the bridge circuit of FIG. 1C as a function of a magnetic field that is applied to the bridge circuit, according to aspects of the disclosure.

FIGS. 1E-F show the effects of the temperature gradient ΔT on the operation of the sensor die 120. FIG. 1E shows the individual output voltages V1 and V2 that are produced at the output terminals of the bridge circuit 110. The individual output voltages V1 and V2 are plotted as a function of the differential magnetic field 128A-B that is applied to the sensor die 120. FIG. 1F shows the differential voltage ΔV=V2−V1 that is produced by the bridge circuit 110. The differential voltage ΔV is plotted as a function of the differential magnetic field 128A-B that is applied to the sensor die 120. As illustrated, for any given temperature gradient ΔT, the voltage measured at the bridge output V1 is increased and the voltage measured at the bridge output V2 is decreased. This results in an offset of the differential bridge output ΔV=V2−V1, which is directly proportional to the temperature gradient ΔT. This offset may be hard to compensate for accurately in applications that require high precision.

Figure 2B:
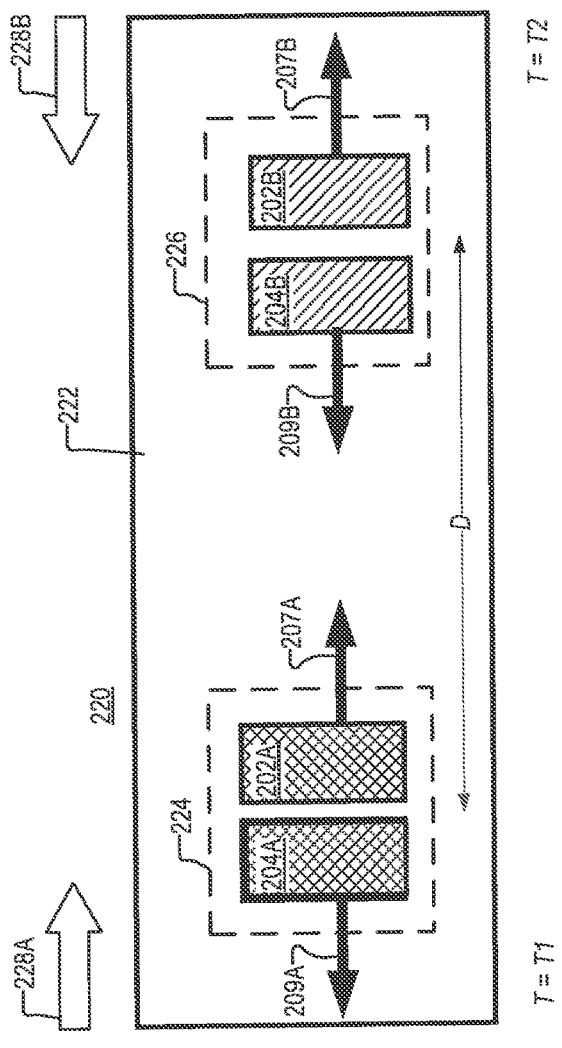
FIG. 2B is a schematic diagram of a sensor die including the bridge circuit of FIG. 2A, according to aspects of the disclosure.
Figure 2A:
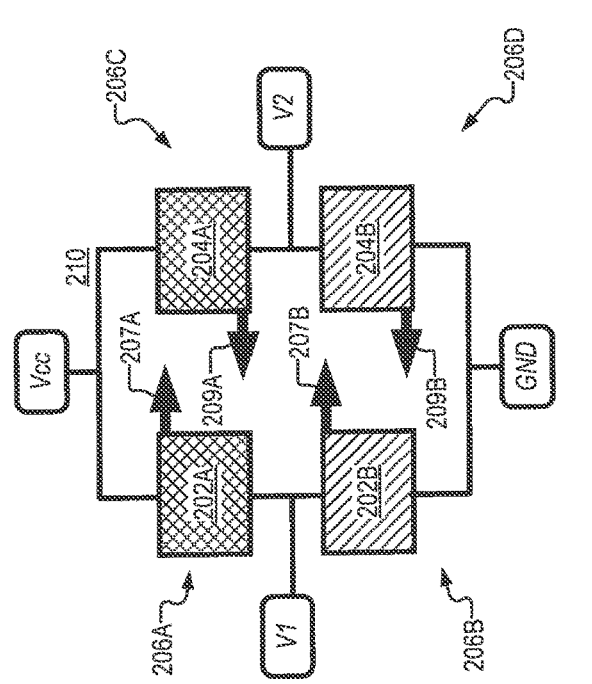
FIG. 2A is a diagram of an example of a bridge circuit, according to aspects of the disclosure.

FIG. 2A shows an example of a bridge circuit 210, according to aspects of the disclosure. The bridge circuit 210 is suitable for use in current sensors. In contrast to the bridge circuit 110 of FIGS. 1E-F, the effect of temperature gradients across the die is reduced.

According to the example of FIG. 2A, the bridge circuit 210 includes a plurality of MR elements 202A,B and a plurality of MR elements 204A,B connected to form a full (or "Wheatstone") bridge. The labels, "VCC" and "GND" indicate voltage and ground supply terminals, respectively. The labels V1 and V2 indicate first and second output voltage terminals of the bridge circuit 210, respectively. On one side of the bridge circuit 210, the MR elements 202A and 202B are connected in series between VCC and GND, such that the MR element 202A forms a first leg 206A of the bridge circuit, and the MR element 202B forms a second leg 206B of the bridge circuit. On the other side of the bridge circuit, the MR elements 204A and 204B are connected in series between VCC and GND, such that the MR element 204A forms a third leg 206C of the bridge circuit 210, and the MR element 204B forms a fourth leg 206D of the bridge circuit 210. A first output voltage terminal "V1" is provided between the first leg 206A and the second leg 206B of the bridge circuit 210. And a second output voltage terminal "V2" is provided between the third leg 206C and the fourth leg 206D of the bridge circuit 210. According to the present example, the MR elements 202 and 204 are giant magnetoresistive (GMR) elements. However alternative implementations are possible in which at least some (or all) of the MR elements 202 and 204 are tunnel magnetoriesistive (TMR) elements and/or any other suitable type of MR element.

FIG. 2B shows a schematic top-down view of a sensor die 220 that includes the bridge circuit 210 of FIG. 2A. The sensor die 220 includes a substrate 222 having the MR elements 202 and 204 formed thereon. The MR elements 202A and 204A are formed in a first region 224 of the substrate 222, while the MR elements 202B and 204B are formed in a second region 226 of the substrate 222. The first region 224 and the second region 226 are separated from each other by a distance D. In some implementations, the distance D between the regions 224 and 226 may be greater than the distance between the MR elements 202 in any of the first region 224 and the second region 226. By way of example, in some implementations, the distance D may be several times greater (e.g., at least 2 times greater, at least 3 times greater, etc.) than the distance between the MR elements 202A and 204A. Additionally, or alternatively, in some implementations, the distance D may be several times greater (e.g., at least 2 times greater, at least 3 times greater, etc.) than the distance between the MR elements 202B and 204B.

The MR elements in the bridge circuit 210 have different pinning directions as shown by arrows 207A-B and 209A-B, which indicate MR element pinning direction. More particularly, in an example embodiment, the MR elements 202A and 202B, which form one side of the bridge circuit (which extends between the GND and Vcc terminals) but located in different regions 224, 226 on the die 220, have the same pinning direction. Similarly, the MR elements 204A and 204B, which are located in different regions 224, 226 form the other side of the bridge circuit (which extends between the GND and Vcc terminals), also have the same pinning direction. However, unlike the bridge circuit 110, the MR elements 202 which form one side of the bridge circuit 210 have different pinning directions from the MR elements 204, which form the other side of the bridge circuit 210.

As noted above, the MR elements of the bridge circuit 210 are distributed on the substrate 222, such that each region of the substrate 222 includes MR elements having different pinning directions. Since MR elements 202A and 204A, which are formed in the first region 224 of the substrate 222, have different pinning directions, and MR elements 202B and 204B, which are formed in the second region 226 of the substrate 222, also have different pinning directions, the response of the MR elements in the different regions tends to cancel out a temperature gradient between the first and second regions 224, 226 of the die.

The sensor die 220 may be exposed to a differential magnetic field 228A-B. In region 224 of the substrate 222, the differential magnetic field 228A is positive, and the temperature is T1. In region 226 of the substrate 222, the differential magnetic field 228B is negative, and the temperature is T2. In other words, according to the present example, a temperature gradient ΔT=T1−T2 is present across the sensor die 220.

Figure 2C:
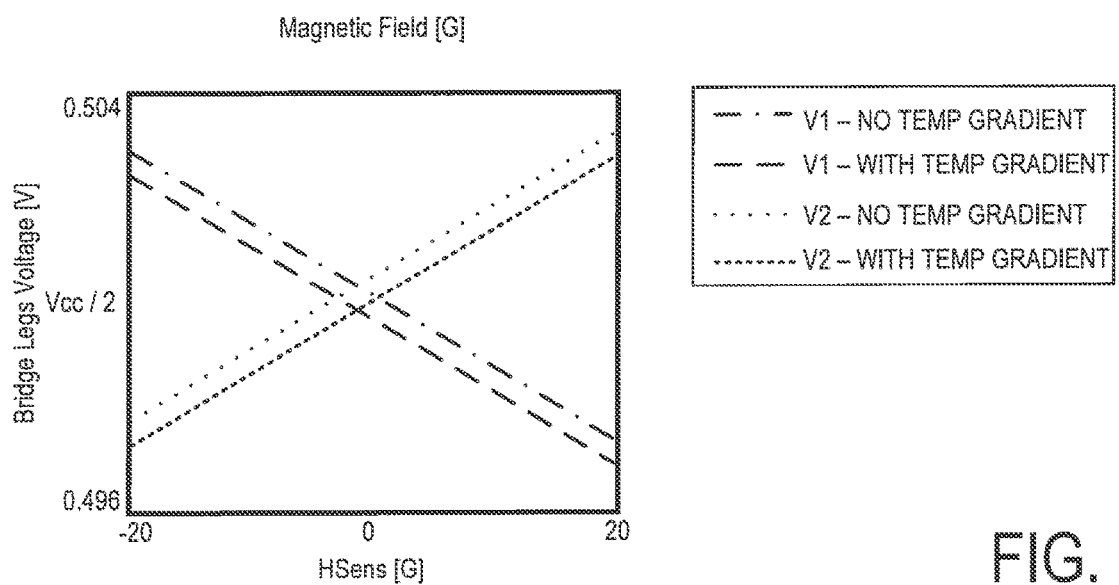
FIG. 2C is a plot illustrating the respective voltages output from the output terminals of the bridge circuit of FIG. 2A as a function of a magnetic field that is applied to the bridge circuit, according to aspects of the disclosure.
Figure 2D:
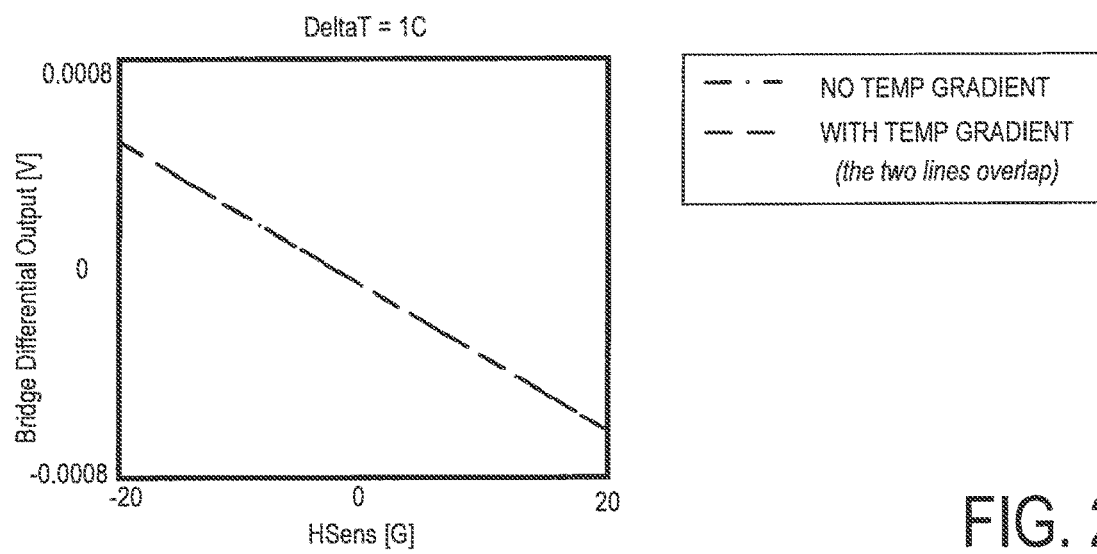
FIG. 2D is a plot of a differential voltage output from the bridge circuit of FIG. 2A as a function of a magnetic field that is applied to the bridge circuit, according to aspects of the disclosure.

One advantage which the sensor die 220 has over the sensor die 120 of FIG. 1D is that the sensor die 220 is relatively insensitive to temperature gradients, as illustrated by FIGS. 2C-D. FIG. 2C shows the respective voltage V1 and V2, which are produced at the output terminals of the bridge circuit 210. The voltages V1 and V2 are plotted as a function of the differential magnetic field 228A-B that is applied to the sensor die 220. FIG. 2D shows a plot of the differential voltage ΔV=V2−V1, which is produced by the bridge circuit 210. The differential voltage ΔV is also plotted as a function of the differential magnetic field 228A-B that is applied to the sensor die 220. The plots shown in FIGS. 2C-D illustrate that for any given temperature gradient ΔT=T1−T2, the voltage measured at the bridge output V1 is increased and the voltage measured at the bridge output V2 is also increased. As a result of this, the differential bridge output delta ΔV (of the sensor die 220) is substantially insensitive to the temperature gradient ΔT.

Figure 2E:
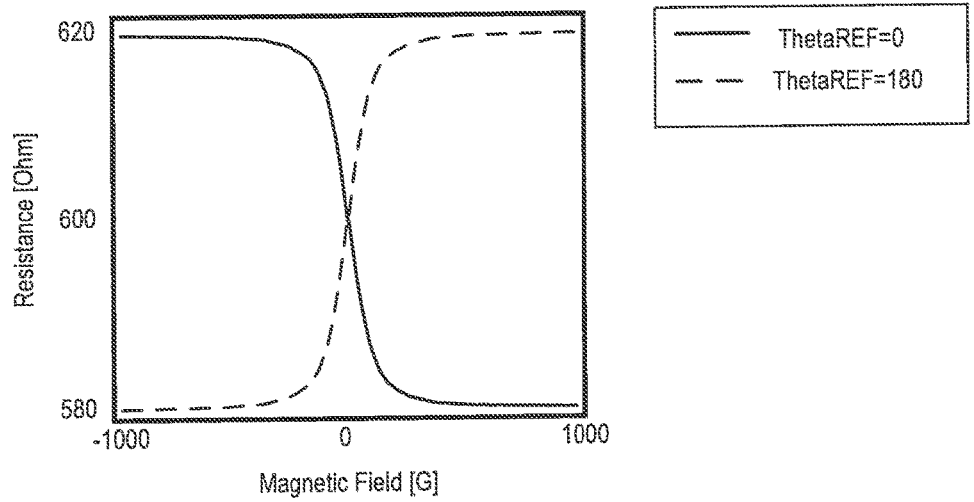
FIG. 2E is a plot illustrating the change of the respective resistances of MR elements that are arranged to have opposing pinning directions of their respective reference layers, when the MR elements are exposed to an applied magnetic field, according to aspects of the disclosure.

FIG. 2E shows a plot of the resistance variation of any of the MR elements 202 and 204 as a function of an applied magnetic field. FIG. 2E illustrates that the pinning direction of any of the MR elements 202 and 204 is setting the polarity of the MR element's resistance variation when the differential magnetic field 228A-B is applied to the MR element. As illustrated, a positive resistance variation can be obtained by applying a positive field to a positive-oriented MR element or by applying a negative field to a negative-oriented MR element. When resistances having different (e.g., opposite) pinning directions are placed at different locations on the sensor die 220, this may allow the bridge circuit 110 to discriminate the resistance variation resulting from the field to be sensed (the two resistances will drift in the same direction) and the resistance variation resulting from a temperature gradient ΔT.

Figure 2F:
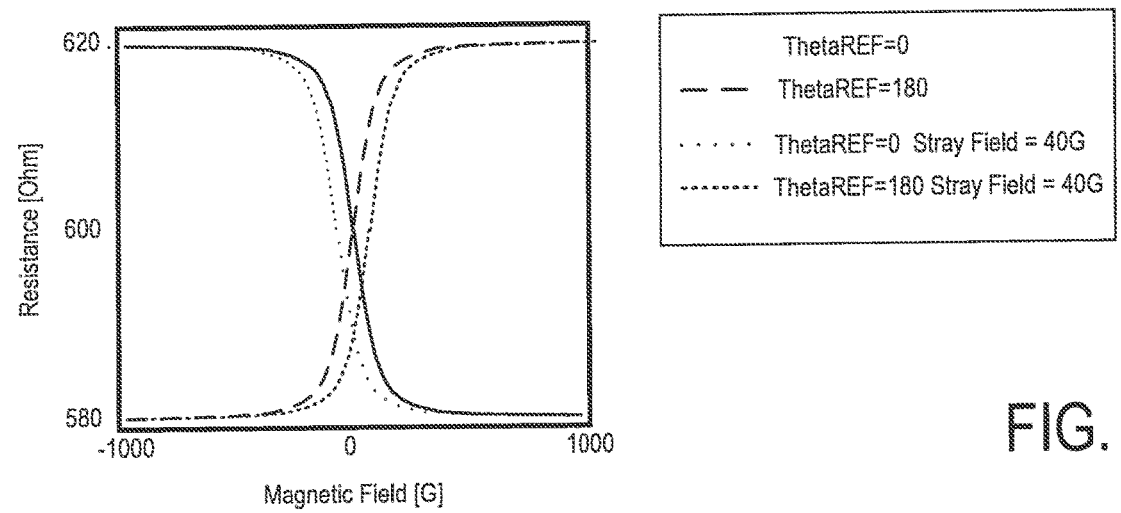
FIG. 2F is a plot illustrating the effect of stray magnetic fields on the respective resistances of FIG. 2E, according to aspects of the disclosure.

FIG. 2F shows a plot illustrating the effect of stray fields on the sensor die 220. In particular, FIG. 2F illustrates that if a stray field is applied to the sensor die 220, the resistance of the MR elements in one side of the bridge circuit 210 will shift in one direction, while the resistance of the MR elements in the other side of the bridge circuit 210 will shift in another (e.g., opposite) direction. Depending on the implementation, the same or different current may flow in each leg of the bridge when the bridge is exposed to a temperature gradient.

According to the example of FIGS. 2A-F, the MR elements 202A and 204A have opposite pinning directions—i.e., they have pinning directions that are 180 degrees apart. However, alternative implementations are possible in which the pinning directions of the MR elements 202A and 204A are different by less (or more) than 180 degrees. Furthermore, in the present example, the MR elements 202B and 204B also have opposite pinning directions—i.e., they have pinning directions that are 180 degrees apart. However, alternative implementations are possible in which the pinning directions of the MR elements 204A and 204B are different by less (or more) than 180 degrees. Moreover, in the example of FIGS. 2A-F, MR elements 202A and 202B have the same orientation and MR elements 204A and 304B have the same orientation. In the example of FIGS. 2A-B, the pinning direction of each one of the MR elements 202/204 is illustrated by the arrow that is attached to the MR element. Specifically, arrow 207A indicates the pinning direction of the MR element 202A, arrow 207B indicates the pinning direction of the MR element 202B, arrow 209A indicates the pinning direction of the MR element 204A, and arrow 209B indicates the pinning direction of MR element 204B. MR elements 202/204 having the same pinning direction are attached to arrows with the same orientation. MR elements 202/204 having different pinning directions are attached to arrows with different orientations. Although in the example of FIGS. 2A-F, the sensor die 220 includes only the MR elements 202A, 202B, 204A, and 204B, alternative implementations are possible in which other components are also present on the sensor die 220 (or in the bridge circuit 210). Stated succinctly, the present disclosure is not limited to the example of the sensor die 220 (or bridge circuit 210), which is shown in FIGS. 2A-F.

Figure 3B:
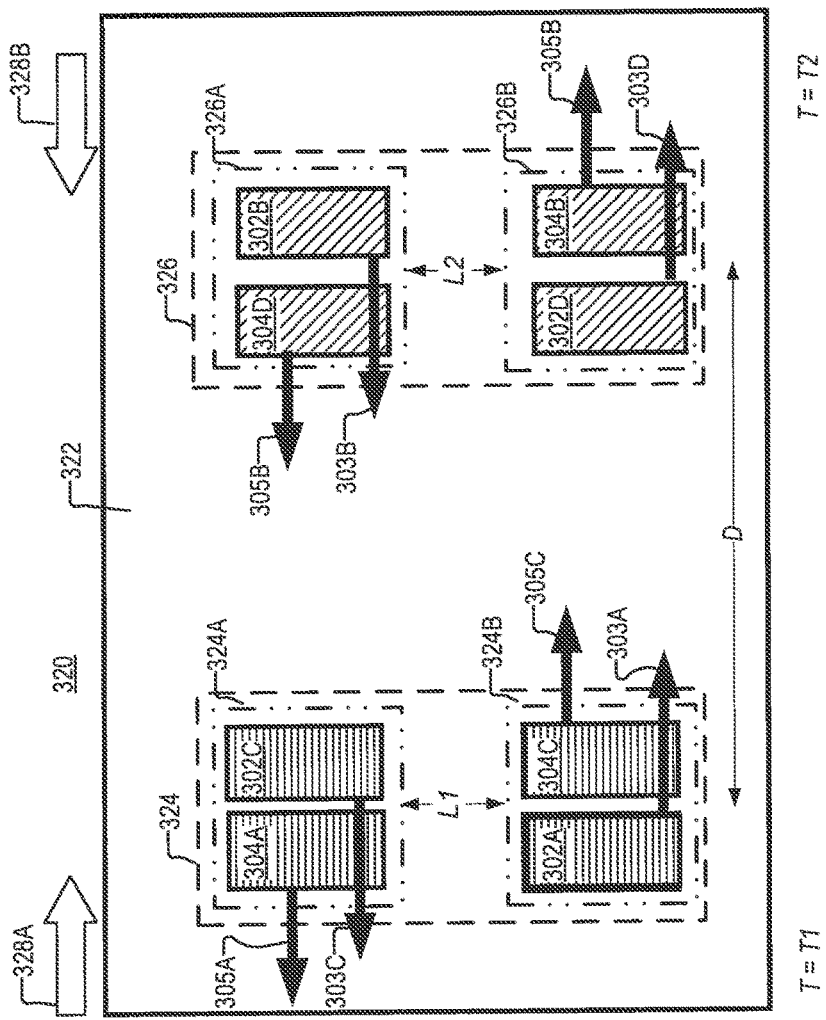
FIG. 3B is a schematic diagram of a sensor die including the bridge circuit of FIG. 3A, according to aspects of the disclosure.
Figure 3A:
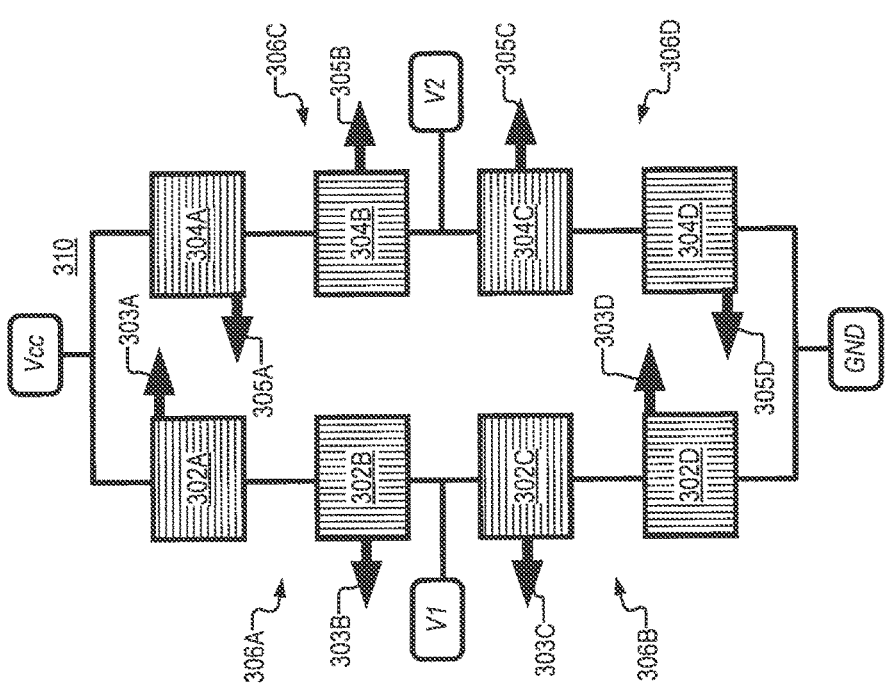
FIG. 3A is a diagram of an example of a bridge circuit, according to aspects of the disclosure.

FIG. 3A shows an example of a bridge circuit 310, according to aspects of the disclosure. The bridge circuit 310 is suitable for use in current sensors. Unlike the bridge circuit 210, the individual voltage outputs V1 and V2 of the bridge circuit 310 are relatively unaffected by the presence of temperature gradients.

According to the example of FIG. 3A, the bridge circuit 310 includes a series of MR elements 302 and a series of MR elements 304 connected to form a full (or "Wheatstone") bridge. The labels, "VCC" and "GND" indicate voltage and ground supply terminals, respectively. The labels V1 and V2 indicate first and second output voltage terminals, respectively. On one side of the bridge circuit, the MR elements 302 are connected in series between VCC and GND, such that the MR elements 302A and 302B form a first leg 306A of the bridge circuit 310 and the MR elements 302C and 302D form a second leg 306B of the bridge circuit 310. On the other side of the bridge circuit, the MR elements 304 are connected in series between VCC and GND, such that the MR elements 304A and 304B form a third leg 306C of the bridge circuit 310, and the MR elements 304C and 304D form a fourth leg 306D of the bridge circuit 310. A first output voltage terminal "V1" is provided between the first leg 306A and the second leg 306B of the bridge circuit 310. And a second output voltage terminal "V2" is provided between the third leg 306C and the fourth leg 306D of the bridge circuit 310. According to the present example, the MR elements 302 and 304 are giant magnetoresistive (GMR) elements. However alternative implementations are possible in which at least some (or all) of the MR elements 302 and 304 are tunnel magnetoresistive (TMR) elements and/or any other suitable type of MR elements.

FIG. 3B shows a schematic top view of a sensor die 320 that includes the bridge circuit 310 of FIG. 3A. The sensor die 320 includes a substrate 322 having the MR elements 302 and 304 formed thereon. MR elements 302A, 302C, 304A, and 304C are formed in a first region 324 of the substrate 322. MR elements 302B, 304B, 302D, and 304D are formed in a second region 326 of the substrate 322. The first region 324 and the second region 326 are separated from each other by a distance D. The distance D between the first region 324 and the second region 326 may be greater than the distance between neighboring MR elements in any of the first region 324 and the second region 326. For example, in some implementations, the distance D may be several times greater (e.g., at least 2 times greater, at least 3 times greater, etc.) than the distance between MR elements 302A and 304A or the distance between MR elements 302C and 304C. Additionally or alternatively, the distance D may be several times greater (e.g., at least 2 times greater, at least 3 times greater, etc.) than the distance between MR elements 302B and 304B or the distance between MR elements 302D and 304D.

Each leg 306 of the bridge circuit 310 includes a respective pair of MR elements 302/304. The MR elements in each pair have different pinning directions, as illustrated by arrows 303A-D and 305A-D respectively. For instance, MR elements 302A and 302B, which form the first leg 306A, have different pinning directions, as indicated by arrows 303A and 303B, respectively; MR elements 302C and 302D, which form the second leg 306B, have different pinning directions, as indicated by arrows 303C and 303D, respectively; MR elements 304A and 304B, which form the third leg 306C, have different pinning directions, as indicated by arrows 305A and 305B, respectively; and MR elements 304C and 304D, which form the fourth leg 306D, have different pinning directions, as indicated by arrows 305C and 305D, respectively. According to the present example, the MR elements in leg 306 (or pair) have opposite pinning directions—i.e., they have pinning directions that are 180 degrees apart. However, alternative implementations are possible in which MR elements in any of the pairs have pinning directions that differ by less (or more) than 180 degrees. In the example of FIGS. 3A-B, the pinning direction of each one of the MR elements 302/304 is illustrated by the arrow that is attached to the MR element. Specifically, arrow 303A indicates the pinning direction of the MR element 302A, arrow 303B indicates the pinning direction of the MR element 302B, arrow 303C indicates the pinning direction of the MR element 302C, arrow 303D indicates the pinning direction of the MR element 302D, arrow 305A indicates the pinning direction of the MR element 304A, arrow 305B indicates the pinning direction of the MR element 304B, arrow 305C indicates the pinning direction of the MR element 304C, and arrow 305D indicates the pinning direction of the MR element 304D. MR elements 302/304 having the same pinning direction are attached to arrows with the same orientation. MR elements 302/304 having different pinning directions are attached to arrows with different orientations.

In some implementations, each pair of MR elements (e.g., the MR elements that form each leg 306 of the bridge circuit 310) may be split between the first region 324 and the second region 326 of the substrate 322. For instance, MR element 302A may be formed in the first region 324 and MR element 302B may be formed in the second region 326; MR element 302C may be formed in the first region 324 and MR element 302D may be formed in the second region 326; MR element 304A may be formed in the first region 324 and MR element 304B may be formed in the second region 326; and MR element 304C may be formed in the first region 324 and MR element 304D is formed in the second region 326.

Additionally or alternatively, in some implementations, the MR elements may be arranged on the substrate 322, such that MR elements 302/304 from each side of the bridge circuit 310, that are formed in the same one of the regions 324 and 326, have different pinning directions. For example, the MR elements 302 formed in the first region 324 (e.g. MR elements 302A and 302C) have different pinning directions, and the MR elements 302 formed in the second region 326 (e.g. MR elements 302B and 302D) also have different pinning directions. Similarly, the MR elements 304 formed in the first region 324 (e.g. MR elements 304A and 304C) may have different pinning directions, and each of the MR elements 304 formed in the second region 326 (e.g. MR elements 304B and 304D) may have different pinning directions.

Additionally or alternatively, in some implementations, the MR elements in the first region 324 may be arranged in pairs, such that each pair of MR elements is placed in a different subregion of the first region 324. For example, a pair including the MR elements 304A and 302C may be placed in a subregion 324A, and a pair including the MR elements 302A and 304C may be placed in a subregion 324B. As illustrated, each pair may include MR elements from different legs 306 of the bridge circuit 310 that have the same pinning direction. In some implementations, the first subregion 324A and the second subregion 324B may be separated by a distance L1. In some implementations, the distance L1 may be smaller than the distance D which separates the first region 324 from the second region 326.

Additionally or alternatively, in some implementations, the MR elements in the second region 326 may be arranged in pairs, such that each pair of MR elements is placed in a different subregion of the second region 326. For example, a pair including the MR elements 304D and 302B may be placed in a subregion 326A, and a pair including the MR elements 302D and 304B may be placed in a subregion 326B. As illustrated, each pair may include MR elements from different legs 306 of the bridge circuit 310 that have the same pinning direction. In some implementations, the first subregion 324A and the second subregion 324B may be separated by a distance L2, which is the same or different from the distance L1. In some implementations, the distance L2 may be smaller than the distance D which separates the first region 324 from the second region 326. Although in the present example the respective elements in each of the subregions 324A, 324B, 326A, and 326B have the same pinning direction, alternative implementations are possible in which the respective elements in each of the subregions 324A, 324B, 326A, and 326B have the different (e.g., opposite, etc.) directions.

The sensor die 320 may be exposed to a differential magnetic field 328 A-B. In region 324, the differential magnetic field 328A may be positive, and the temperature may be T1. In region 326 of the substrate 322, the differential magnetic field 328B may be negative, and the temperature may be T2. In other words, according to the present example, a temperature gradient $\Delta T=T1-T2$ may be present across the sensor die 320. Because the MR elements in each leg 306 are formed in different regions of the substrate 322, and have different pinning directions, when any of the legs 306 is subjected to the temperature gradient $\Delta T$, the resistance of one of the MR elements in the leg 306 may increase, while the resistance of the other MR element in the same leg 306 is decreased. This in turn may permit the individual voltage outputs of the bridge circuit 310 to remain unaffected by the temperature gradient $\Delta T$.

Figure 3C:
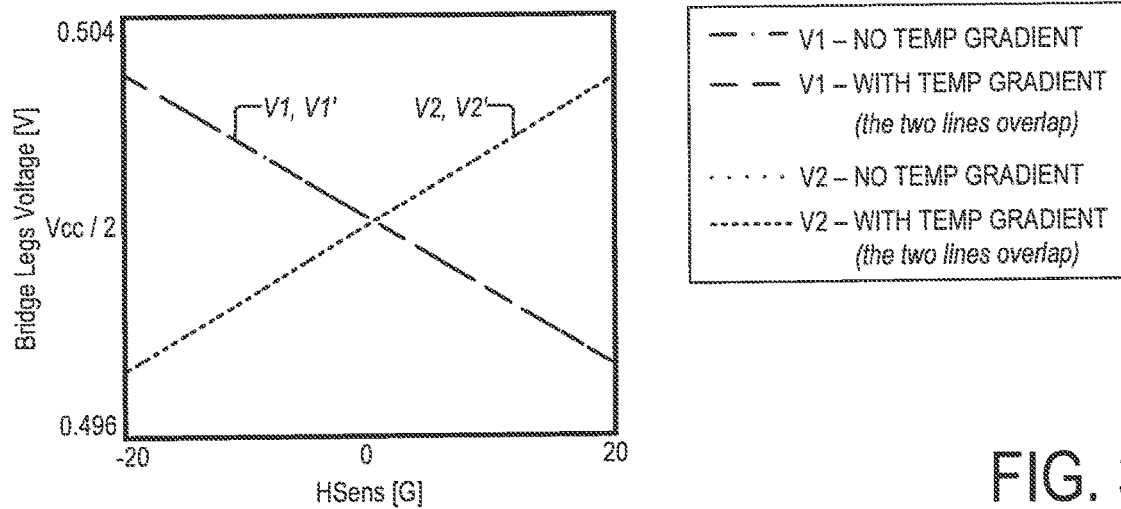
FIG. 3C is a plot illustrating the respective voltages output from the output terminals of the bridge circuit of FIG. 3A as a function of a magnetic field that is applied to the bridge circuit, according to aspects of the disclosure.

FIG. 3C shows the individual voltage outputs V1 and V2 that are produced at the output terminals of the bridge circuit 310. The individual voltage outputs V1 and V2 are plotted as a function of the differential magnetic field 328A-B that is applied to the sensor die 320. As illustrated in FIG. 3C, the individual voltage outputs V1 and V2 of the bridge circuit 310 remain unchanged when the bridge circuit 310 is subjected to a temperature gradient. This is in contrast to the sensor die 220 in which the individual voltage outputs V1 and V2 shift when the sensor die 220 is subjected to a temperature gradient.

Figure 3D:
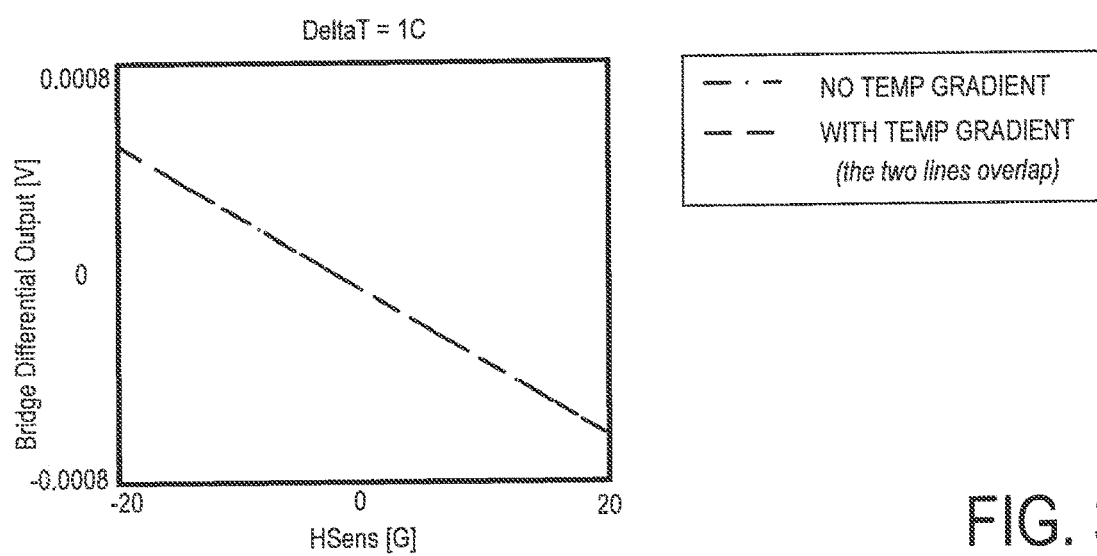
FIG. 3D is a plot of a differential voltage output from the bridge circuit of FIG. 3A as a function of a magnetic field that is applied to the bridge circuit, according to aspects of the disclosure.

FIG. 3D shows a plot of the differential voltage $\Delta V=V2-V1$, which is produced by the bridge circuit 310. The differential voltage $\Delta V$ is plotted as a function of the differential magnetic field 328A-B that is applied to the sensor die 320. As illustrated, the differential voltage output by the bridge circuit 310 also remains unchanged when the sensor die 320 is subjected to a temperature gradient. This is similar to the sensor die 220 in which the differential voltage output is also unaffected by temperature gradients.

Figure 4A:
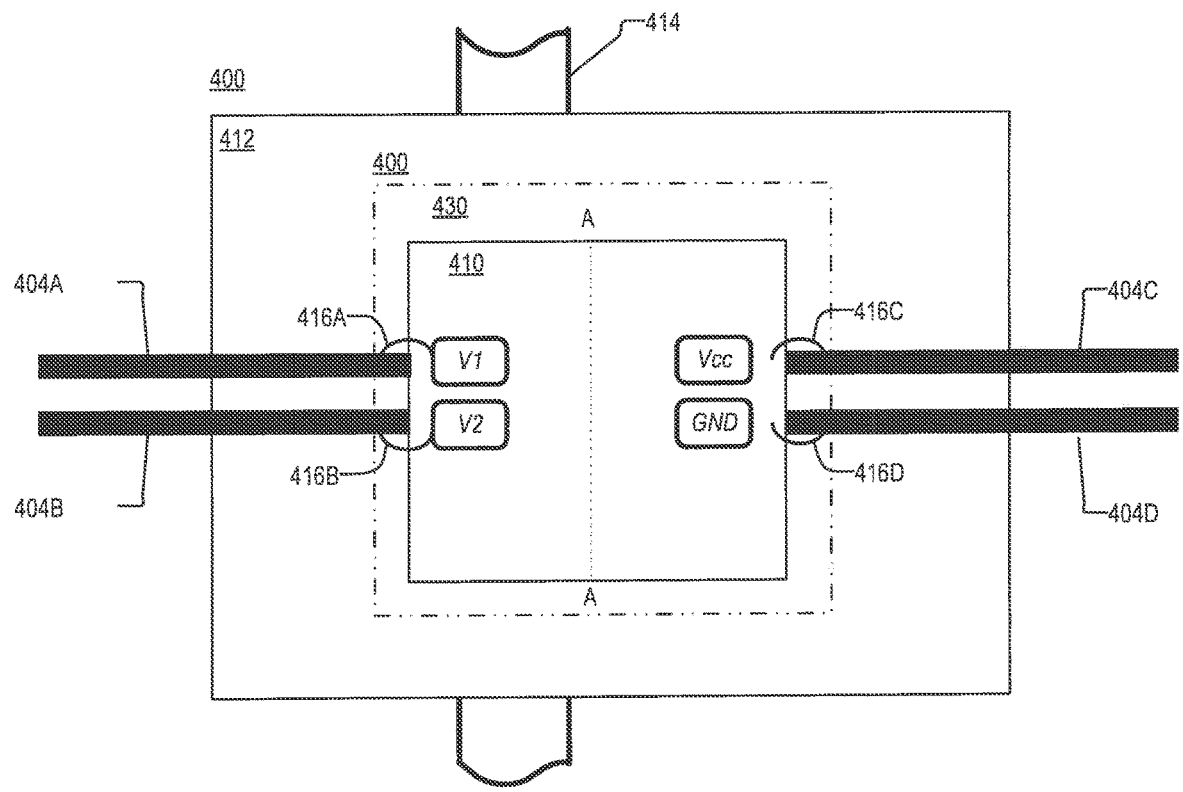
FIG. 4A is a schematic top-down view of an example of a current sensor, according to aspects of the disclosure.
Figure 4B:
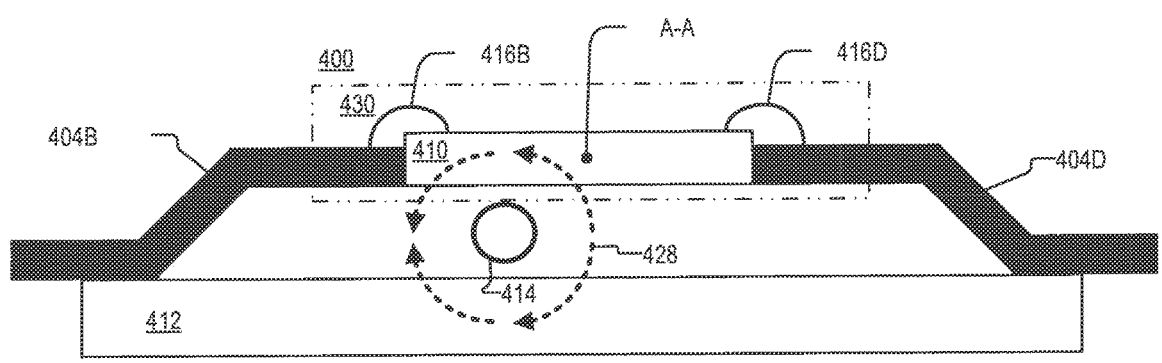
FIG. 4B is a schematic cross-sectional side view of the current sensor of FIG. 4A, according to aspects of the disclosure.

FIGS. 4A-B show an example of a current sensor 400, according to aspects of the disclosure. As illustrated, the sensor 400 may include a sensor die 410 that is encapsulated inside a body 430. In some implementations, the sensor die 410 may be the same or similar to one of the sensor dies 220 and 320. As such, the sensor die 410 may include a voltage supply terminal Vcc, a ground terminal GND, and output terminals V1 and V2. Each of these terminals may be electrically coupled to a different one of the lead frames 404 via a respective bonding wire 416. In operation, the current sensor 400 may be mounted on a circuit board 412, for example, and arranged to straddle a current conductor 414, as shown. The circuitry formed on the sensor die 410 (e.g., the bridge circuit 210 or the bridge circuit 310), may be configured to be sensitive to a differential magnetic field 428 that is created as a result of current flowing through the current conductor 414 in a particular direction in relation to the MR elements. The differential voltage output through the output terminals V1 and V2 may be proportional to magnetic field gradient intensity, as discussed above with the sensor dies 220 and 320.

In some implementations, the conductor 414 may be offset relative to the central axis A-A of the sensor die 410, as shown. When the conductor is offset, the temperature gradient across to the central die may be increased, as a result of heat emanating from the conductor 410. In this regard, implementing one of the bridge circuits 210 and 310 on the sensor die 410 may help counter the effects of the temperature gradient on the sensor 400. Although in the present example the conductor 414 runs in parallel with the central axis A-A, alternative implementations are possible in which the conductor 414 is arranged at an angle with respect to the central axis A-A. Although in the present example the conductor 414 is offset from the central axis A-A, alternative implementations are possible in which the conductor 414 is aligned with the central axis A-A. Stated succinctly, the present disclosure is not limited to any specific configuration of the conductor 414.

Figure 5A:
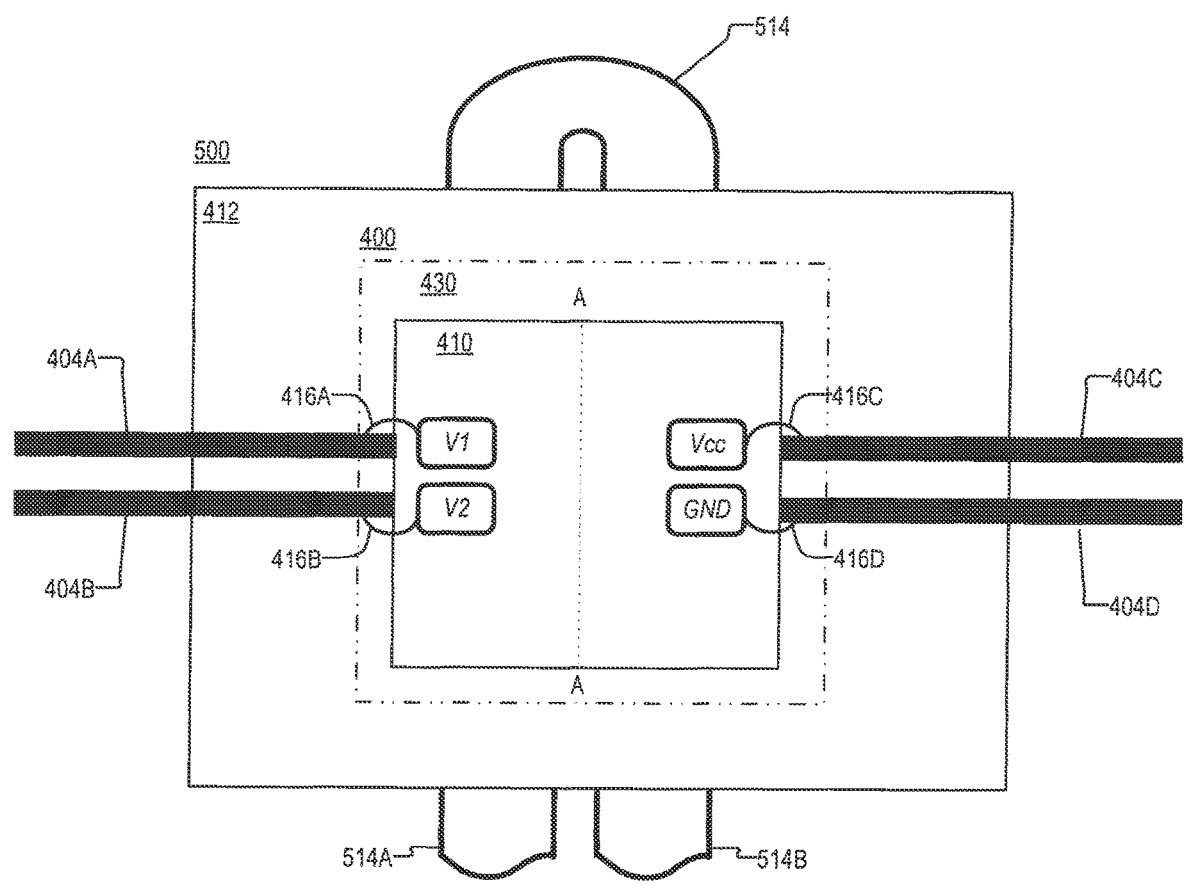
FIG. 5A is a schematic top-down view of an example of a current sensor, according to aspects of the disclosure.
Figure 5B:
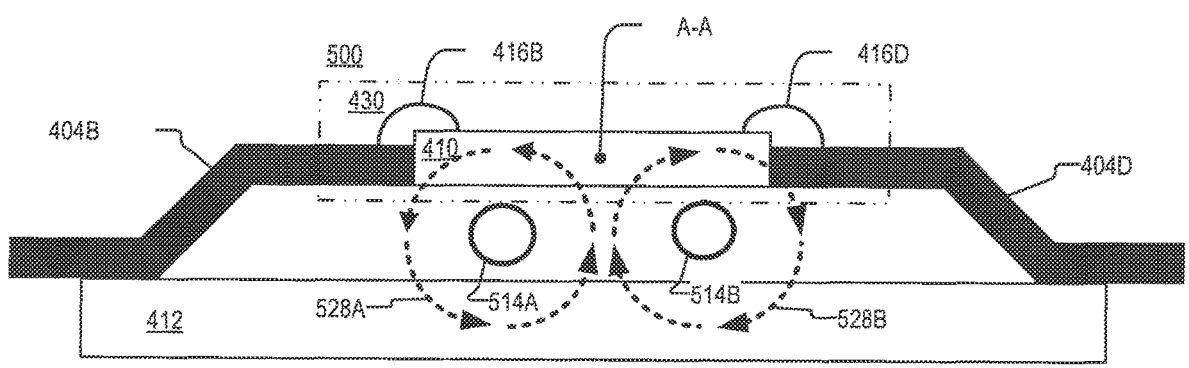
FIG. 5B is a schematic cross-sectional side view of the current sensor of FIG. 5A, according to aspects of the disclosure.
Figure 1E:
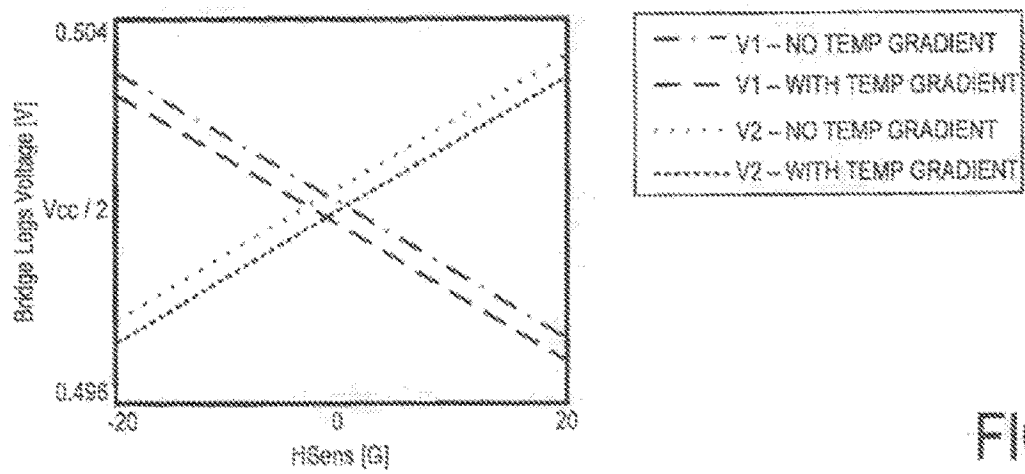
Figure 1F:
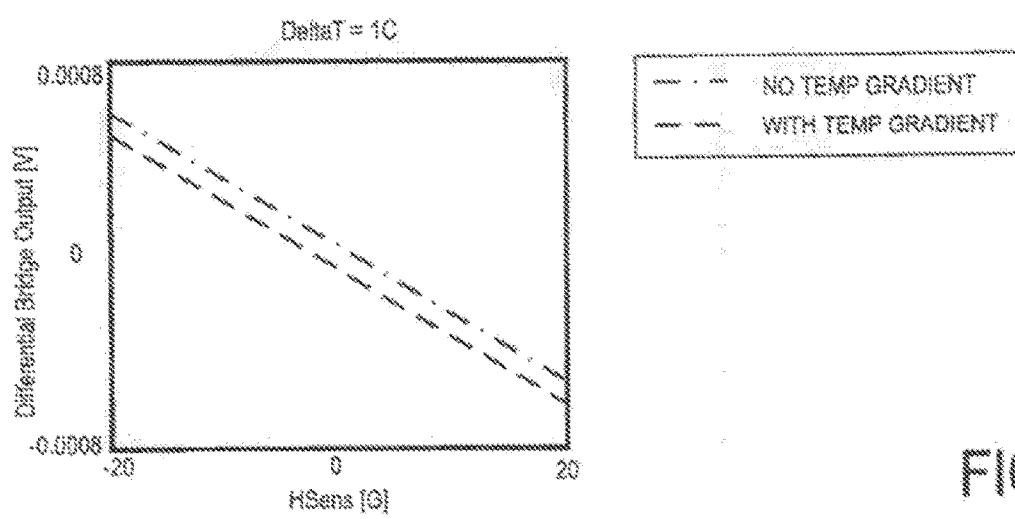

FIGS. 5A-B show an example of a current sensor 500, according to aspects of the disclosure. The structure of the sensor 500 may be the same or similar to that of the sensor 400, except for that the sensor 500 including a U-shaped conductor 514 disposed underneath the sensor die 410. The conductor 514 may have a first portion 514A and a second portion 514B that produce a differential magnetic field 528A-B, as shown. More particularly, the portion 514A may provide a positive contribution 528A to the differential magnetic field 514A-B and the portion 514B may provide a negative contribution 528B to the differential magnetic field 514A-B. According to the present example, the U-shape defined by the conductor 514 is substantially symmetrical with respect to the central axis A-A of the sensor die 410. However, alternative implementations are possible in which the U-shape defined by the conductor 514 is not symmetrical with respect to the central axis A-A.

In other embodiments, a sensor can include an IO pin(s) for coupling to a conductor having a current for which it is desirable to sense. The current from the IO pin travels through the sensor in a particular path for creating a magnetic field in relation to on-board MR elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures. Although FIG. 2B does not show the respective connections between MR elements 202/204, it will be understood that the MR elements 202/204 may be connected to one another in the manner shown in FIG. 2A. Although FIG. 3B does not show the respective connections between MR elements 302/304, it will be understood that the MR elements 302/304 may be connected to one another in the manner shown in FIG. 3A.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A system comprising:
a substrate having a first region and a second region,
a conductor that is disposed adjacent to the substrate, the conductor being configured to generate a magnetic field, wherein the conductor is positioned relative to the substrate in such a way that the magnetic field in one of the first region and the second region is positive and the magnetic field in the other one of the first region and the second region is negative;
a first magnetoresistive (MR) element that is formed in a first portion of the first region, the first MR element having a first pinning direction;
a second MR element that is formed in a second portion of the first region, the second MR element having a second pinning direction that is opposite to the first pinning direction;
a third MR element that is formed in a first portion of the second region, the third MR element having the first pinning direction; and
a fourth MR element that is formed in a second portion of the second region, the fourth MR element having the second pinning direction,
wherein the first MR element, the second MR element, the third MR element, and the fourth MR element are coupled in series,
wherein the first MR element, the second MR element, the third MR element, and the fourth MR element are part of a same sensing bridge,
wherein the first portion of the first region and the second portion of the second region are diagonally opposed, and the second portion of the first region and the first portion of the second region are diagonally opposed, and
wherein the system is configured to use the first, second, third, and fourth MR elements to generate an output signal that is indicative of a level of electrical current through the conductor.

2. The system of claim 1, further comprising a body arranged to encapsulate the substrate, and the first, second, third, and fourth MR elements.

3. The system of claim 1, wherein at least one of the first, second, third, and fourth MR elements includes a giant magnetoresistance (GMR) element.

4. The system of claim 1, wherein at least one of the first, second, third, and fourth MR elements includes a tunnel magnetoresistance (TMR) element.

5. The system of claim 1, wherein the first region and the second region are spaced apart from one another by a distance that is greater than a distance between at least two of the MR elements in the first region.

6. The system of claim 1, wherein the second MR element is coupled to a voltage source, the fourth MR element is coupled to ground, and a voltage supply line is coupled between the third MR element and the first MR element.

7. The system of claim 1, wherein the first MR element and the second MR element are disposed on a first side of an output terminal of the sensing bridge, and the second MR element and the third MR element are disposed on a second side of the output terminal that is opposite to the first side.

8. The system of claim 1, wherein the conductor is offset from a central axis of the substrate.

9. The system of claim 1, wherein the sensing bridge includes a full bridge circuit.

10. A system comprising:
a substrate having a first region and a second region,
a U-shaped conductor configured to generate a magnetic field, wherein the conductor is positioned relative to the substrate in such a way that the magnetic field in one of the first region and the second region is positive and the magnetic field in the other one of the first region and the second region is negative;

a first pair of magnetoresistive (MR) elements that are formed in a first portion of the first region, each of the MR elements in the first pair having a first pinning direction;

a second pair of MR elements that are formed in a second portion of the first region, each of the MR elements in the second pair having a second pinning direction that is opposite to the first pinning direction;

a third pair of MR elements that are formed in a first portion of the second region, each of the MR elements in the third pair having the first pinning direction; and a fourth pair of MR elements that are formed in a second portion of the second region, each of the MR elements in the fourth pair having the second pinning direction, wherein the first portion of the first region and the second portion of the first region are formed on a first side of the substrate, wherein the first portion of the second region and the second portion of the second region are formed on a second side of the substrate that is opposite to the first side, wherein the first portion of the first region and the second portion of the second region are diagonally opposed, and the second portion of the first region and the first portion of the second region are diagonally opposed, and wherein the system is configured to use the first, second, third, and fourth pairs of MR elements to generate an output signal that is indicative of a level of electrical current through the conductor.

11. The system of claim 10, wherein the conductor is disposed under the substrate.

12. The system of claim 10, wherein at least one of the MR elements in any of the first, second, third, and fourth pair of MR elements includes a giant magnetoresistance (GMR) element.

13. The system of claim 10, wherein at least one of the MR elements in any of the first, second, third, and fourth pair of MR elements includes a tunnel magnetoresistance (TMR) element.

14. The system of claim 10, wherein the first region and the second region are spaced apart from one another by a distance that is greater than a distance between at least two of the MR elements in the first region.

15. The system of claim 10, wherein the first, second, third, and fourth pairs of MR elements are arranged in a bridge circuit.

16. The system of claim 10, wherein:

each of the first, second, third, and fourth pairs includes a respective first MR element and a respective second MR element, the respective first MR elements are coupled in series, such that one of the respective first MR elements is coupled to a voltage source, another one of the respective first MR elements is coupled to a ground source, and a first signal output line is coupled between the remaining two of the first MR elements, and the respective second MR elements are coupled in series, such that one of the respective second MR elements is coupled to the voltage source, another one of the respective second MR elements is coupled to a ground source, and a second signal output line is coupled between the remaining two of the second MR elements.

17. A system comprising:

a substrate having a first region and a second region, a conductor configured to generate a magnetic field, wherein the conductor is positioned relative to the substrate in such a way that the magnetic field in one of the first region and the second region is positive and the magnetic field in the other one of the first region and the second region is negative;

a first pair of magnetoresistive (MR) elements that are formed in a first portion of the first region, each of the MR elements in the first pair having a first pinning direction;

a second pair of MR elements that are formed in a second portion of the first region, each of the MR elements in the second pair having a second pinning direction that is opposite to the first pinning direction;

a third pair of MR elements that are formed in a first portion of the second region, each of the MR elements in the third pair having the first pinning direction; and a fourth pair of MR elements that are formed in a second portion of the second region, each of the MR elements in the fourth pair having the second pinning direction, wherein the system is configured to use the first, second, third, and fourth pairs of MR elements to generate an output signal that is indicative of a level of electrical current through the conductor, wherein the first portion of the first region and the second portion of the first region are formed on a first side of the substrate, wherein the first portion of the second region and the second portion of the second region are formed on a second side of the substrate that is opposite to the first side, and wherein the first portion of the first region and the second portion of the second region are diagonally opposed, and the second portion of the first region and the first portion of the second region are diagonally opposed.

18. The system of claim 17, further comprising a body arranged to encapsulate the substrate, and the first, second, third, and fourth pairs of MR elements.

19. The system of claim 17, wherein the first region and the second region are spaced apart from one another by a distance that is greater than a distance between at least two of the MR elements in the first region.

20. The system of claim 17, wherein at least one of the MR elements in any of the first, second, third, and fourth pair of MR elements includes a giant magnetoresistance (GMR) element.

21. The system of claim 17, wherein at least one of the MR elements in any of the first, second, third, and fourth pair of MR elements includes a tunnel magnetoresistance (TMR) element.

22. The system of claim 17, wherein the conductor is U-shaped.

23. The system of claim 17, wherein the conductor is disposed under the substrate.

* * * * *

UNITED STATES PATENT AND TRADEMARK OFFICE
CERTIFICATE OF CORRECTION

Page 1 of 3

PATENT NO. : 12,032,042 B2
APPLICATION NO. : 17/660254
DATED : July 9, 2024
INVENTOR(S) : Noémie Belin It is certified that error appears in the above-identified patent and that said Letters Patent is hereby corrected as shown below:

In the Drawings

FIG. 1E, delete the numeral 130, as shown on the attached drawing sheet.

FIG. 1F, delete the numeral 140, as shown on the attached drawing sheet.

In the Specification

Column 4, Line 13 delete "circuit," and replace with --circuit 110,--.

Column 4, Line 14 delete "circuit. On" and replace with --circuit 110. On--.

Column 4, Line 14 delete "circuit," and replace with --circuit 110,--.

Column 5, Line 20 delete "circuit," and replace with --circuit 210,--.

Column 5, Line 20-21 delete "circuit. On" and replace with --circuit 210. On--.

Column 5, Line 58 delete "direction." and replace with --directions--.

Column 6, Line 61 delete "in one side" and replace with --on one side--.

Column 6, Line 63 delete "in the" and replace with --on the--.

Column 7, Line 14 delete "304B" and replace with --204B--.

Column 9, Line 2 delete "is formed" and replace with --may be formed--.

Column 9, Line 43 delete "324A and the second subregion 324B" and replace with --326A and the second subregion 326B--.

Signed and Sealed this
Twenty-second Day of July, 2025

Coke Morgan Stewart
*Acting Director of the United States Patent and Trademark Office*

CERTIFICATE OF CORRECTION (continued)
U.S. Pat. No. 12,032,042 B2

Column 9, Line 52 delete "have the" and replace with --have--.

Column 10, Line 48 delete "410" and replace with --414--.

Column 10, Line 64 delete "including" and replace with --includes--.